United States Patent
Lin et al.

(10) Patent No.: US 10,121,777 B2
(45) Date of Patent: Nov. 6, 2018

(54) SILICON CONTROLLED RECTIFIER

(71) Applicant: Novatek Microelectronics Corp., Hsinchu (TW)

(72) Inventors: Chun-Yu Lin, Hsinchu (TW); Jie-Ting Chen, Yilan County (TW); Ming-Dou Ker, Hsinchu County (TW); Tzu-Chien Tzeng, Hsinchu (TW); Keko-Chun Liang, Hsinchu (TW); Ju-Lin Huang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 93 days.

(21) Appl. No.: 15/275,492

(22) Filed: Sep. 26, 2016

(65) Prior Publication Data

US 2017/0309612 A1    Oct. 26, 2017

Related U.S. Application Data

(60) Provisional application No. 62/327,397, filed on Apr. 25, 2016.

(51) Int. Cl.
*H01L 29/74* (2006.01)
*H01L 27/02* (2006.01)
(Continued)

(52) U.S. Cl.
CPC ...... *H01L 27/0262* (2013.01); *H01L 29/0649* (2013.01); *H01L 29/87* (2013.01)

(58) Field of Classification Search
CPC .......................... H01L 29/87; H01L 27/0262
See application file for complete search history.

(56) References Cited

U.S. PATENT DOCUMENTS 4,939,616 A   7/1990  Rountree
5,465,189 A   11/1995 Polgreen et al.
(Continued)

OTHER PUBLICATIONS

Jang et al., "Novel diode-chain triggering SCR circuits for ESD protection," Solid-State Electronics, vol. 44, Issue 7, Jul. 1, 2000, pp. 1297-1303.
(Continued)

*Primary Examiner* — Steven Loke
*Assistant Examiner* — Scott Stowe
(74) *Attorney, Agent, or Firm* — JCIPRNET

(57) ABSTRACT

A silicon controlled rectifier including a semiconductor substrate, first and second semiconductor wells, first and second semiconductor regions, third and fourth semiconductor regions and a silicide layer is provided. The first and the second semiconductor wells are formed in the semiconductor substrate. The first and the second semiconductor regions are respectively formed in the first and the second semiconductor wells in spaced apart relation. The third and the fourth semiconductor regions are respectively formed in the first and the second semiconductor wells. The silicide layer is formed on the third and the fourth semiconductor regions. The silicon controlled rectifier is at least suitable for high frequency circuit application. The silicon controlled rectifier has a relatively low trigger voltage, a relatively high electrostatic discharge level, and a relatively low capacitance.

9 Claims, 3 Drawing Sheets

(51) Int. Cl.
*H01L 29/87* (2006.01)
*H01L 29/06* (2006.01)

(56) References Cited

U.S. PATENT DOCUMENTS

| | | | |
|---|---|---|---|
| 5,602,404 A * | 2/1997 | Chen | H01L 27/0259 |
| | | | 257/112 |
| 8,952,456 B2 | 2/2015 | Ker et al. | |
| 2002/0109190 A1* | 8/2002 | Ker | H01L 29/7436 |
| | | | 257/355 |
| 2003/0076636 A1 | 4/2003 | Ker et al. | |
| 2004/0027743 A1* | 2/2004 | Higashi | H01L 27/0262 |
| | | | 361/56 |
| 2006/0125054 A1* | 6/2006 | Kim | H01L 27/0262 |
| | | | 257/607 |

OTHER PUBLICATIONS

Sun et al, "Silicon-Controlled Rectifier for Electrostatic Discharge Protection Solutions With Minimal Snapback and Reduced Overshoot Voltage, " IEEE Electron Device Letters, May 2015, pp. 424-426.

* cited by examiner

SILICON CONTROLLED RECTIFIER

CROSS-REFERENCE TO RELATED APPLICATION

This application claims the priority benefits of U.S. provisional application Ser. No. 62/327,397, filed on Apr. 25, 2016. The entirety of the above-mentioned patent application is hereby incorporated by reference herein and made a part of this specification.

BACKGROUND OF THE INVENTION

1. Field of the Invention

The present invention generally relates to a semiconductor structure, in particular, to a semiconductor structure of a silicon controlled rectifier (SCR).

2. Description of Related Art

To preclude the internal circuit of an integrated circuit from being damaged by an electrostatic discharge (ESD) current, an ESD protection device capable of instantly transmitting a significant amount of ESD current is required to be arranged between a power rail and a signal pad. When an ESD positive pulse arrives at the signal pad, the ESD protection device is able to timely guide the ESD current of the signal pad to the power rail. By contrast, when an ESD negative pulse arrives at the signal pad, the ESD protection device is able to transmit the current from the power and/or ground rail to the signal pad. A silicon controlled rectifier is one of the most commonly used ESD protection devices.

The trigger voltage of the conventional silicon controlled rectifier is equivalent to a junction breakdown voltage of N-well and P-well. The junction breakdown voltage is significantly high and about more than ten voltages. In related art, N+ doped region is adopted to reduce the junction breakdown voltage to about ten voltages. However, the significant junction breakdown voltage is still high. In addition, the silicon controlled rectifier has parasitic capacitance. While the silicon controlled rectifier is applied to low-frequency circuits, the parasitic capacitance of the silicon controlled rectifier may be tolerated. However, while the silicon controlled rectifier is applied to the high-frequency circuits, the parasitic capacitance of the silicon controlled rectifier may pose an impact on the high-frequency signals of the signal pad and thus may affect the signal integrity.

Hence, how to reduce the trigger voltage and the capacitance of the parasitic capacitor of the silicon controlled rectifier without compromising the silicon controlled rectifier capability is one of the issues to be resolved in the pertinent field.

SUMMARY OF THE INVENTION

Accordingly, the invention is directed to a silicon controlled rectifier having a relatively low trigger voltage and a relatively low capacitance.

An exemplary embodiment of the invention provides a silicon controlled rectifier. The silicon controlled rectifier includes a semiconductor substrate, first and second semiconductor wells, first and second semiconductor regions, third and fourth semiconductor regions and a silicide layer. The semiconductor substrate includes silicon of a first conductivity type. The first and the second semiconductor wells are formed in the semiconductor substrate. The first and the second semiconductor wells respectively include silicon of a second conductivity type and silicon of the first conductivity type. The first and the second semiconductor regions are respectively formed in the first and the second semiconductor wells in spaced apart relation. The first and the second semiconductor regions respectively include silicon of the first conductivity type and silicon of the second conductivity type. The third and the fourth semiconductor regions are respectively formed in the first and the second semiconductor wells. The third and the fourth semiconductor regions respectively includes silicon of the second conductivity type and silicon of the first conductivity type. The silicide layer is formed on the third and the fourth semiconductor regions.

In an exemplary embodiment of the invention, the third and the fourth semiconductor regions locate in a neighboring region of the first and the second semiconductor wells.

In an exemplary embodiment of the invention, the first and the fourth semiconductor regions are heavily doped regions.

In an exemplary embodiment of the invention, the first semiconductor region is a heavily doped region, and the fourth semiconductor region is a lightly doped region.

In an exemplary embodiment of the invention, the second and the third semiconductor regions are heavily doped regions.

In an exemplary embodiment of the invention, the second semiconductor region is a heavily doped region, and the third semiconductor region is a lightly doped region.

In an exemplary embodiment of the invention, the second conductivity type is different from the first conductivity type.

In an exemplary embodiment of the invention, the silicon controlled rectifier further includes a first insulating region and a second insulating region. The first insulating region is formed in the first semiconductor well. The first insulating region is located between the first and the third semiconductor regions. The second insulating region is formed in the second semiconductor well. The second insulating region is located between the second and the fourth semiconductor regions.

In an exemplary embodiment of the invention, material of the silicide layer is selected from at least one of TiSix, WSix, TaSix, CoSix and PtSi.

In an exemplary embodiment of the invention, the silicon controlled rectifier further includes first and second pads. The first and the second pads are respectively connected to the first and the second semiconductor regions. The first and second pads are respectively connected to a first voltage and a second voltage. The first voltage is higher than the second voltage.

According to the above descriptions, in the exemplary embodiments of the invention, the silicon controlled rectifier includes the third and the fourth semiconductor regions having silicon of different conductivity types. The silicide layer is formed on the third and the fourth semiconductor regions. Accordingly, the silicon controlled rectifier has a relatively low trigger voltage and a relatively low capacitance.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
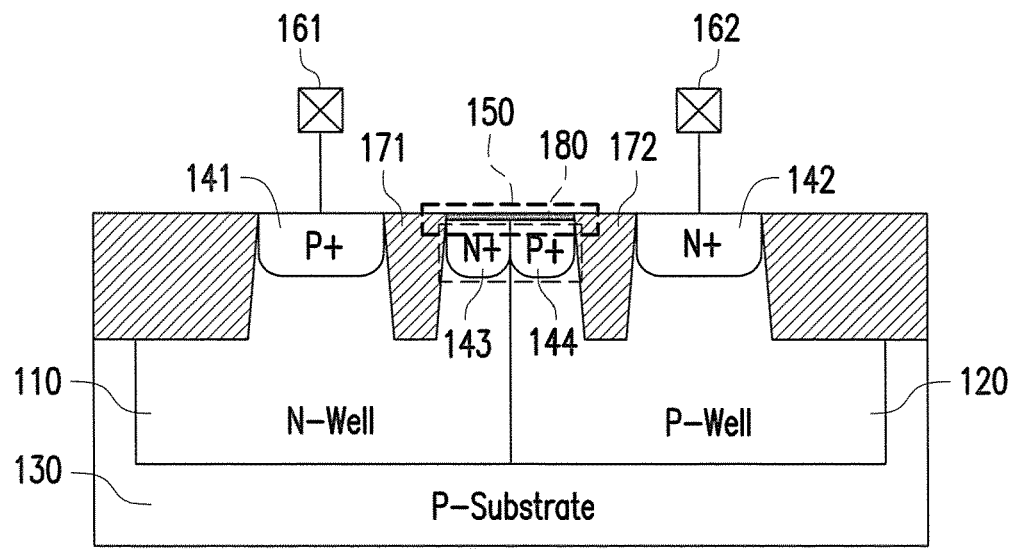
FIG. 1 illustrates a cross-sectional view of a silicon controlled rectifier according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a cross-sectional view of a silicon controlled rectifier according to an embodiment of the invention. Referring to FIG. 1, the silicon controlled rectifier 100 of the present embodiment includes a semiconductor substrate 130, a first semiconductor well 110, a second semiconductor well 120, a first semiconductor region 141, a second semiconductor region 142, a third semiconductor region 143, a fourth semiconductor region 144, and a silicide layer 150. In the present embodiment, the silicon controlled rectifier 100 further includes a first insulating region 171, a second insulating region 172, a first pad 161, and a second pad 162.

To be specific, the first semiconductor well 110 and the second semiconductor well 120 is formed in the semiconductor substrate 130. In the present embodiment, the semiconductor substrate 130 includes p-type silicon and is a p-type substrate. The first semiconductor well 110 includes n-type silicon and is an n-type well. The second semiconductor well 120 includes p-type silicon and is a p-type well.

In the present embodiment, the first semiconductor region 141 and the third semiconductor region 143 are formed in the first semiconductor well 110. The second semiconductor region 142 and the fourth semiconductor region 144 are formed in the second semiconductor well 120. The second semiconductor region 142 and the third semiconductor region 143 are heavily doped n-type regions. In the present embodiment, the first semiconductor well 110 and the second semiconductor well 120 are adjacent and have a neighboring region 180. The third semiconductor region 143 and the fourth semiconductor region 144 locate in the neighboring region 180.

In the present embodiment, the silicide layer 150 is formed on the third semiconductor region 143 and the fourth semiconductor region 144. The material of the silicide layer 150 is selected from at least one of TiSix, WSix, TaSix, CoSix and PtSi. Nevertheless, the invention is not intended to limit the material of the silicide layer 150.

In the present embodiment, the first insulating region 171 is formed in the first semiconductor well 110 and located between the first and the third semiconductor regions 141 and 143. The second insulating region 172 is formed in the second semiconductor well 120 and located between the second and the fourth semiconductor regions 142 and 144. Accordingly, the first and the second semiconductor regions 141 and 142 are respectively forming in the first and the second semiconductor wells 110 and 120 in spaced apart relation as illustrated in FIG. 1. In the present embodiment, the first insulating region 171 and the second insulating region 172 include oxide. Nevertheless, the invention is not intended to limit the material of the insulating region.

In the present embodiment, the first and the second pads 161 and 162 are respectively connected to the first and the second semiconductor regions 141 and 142. The first and the second pads 161 and 162 are respectively connected to a first voltage and a second voltage, and the first voltage is higher than the second voltage. For example, the first pad may be connected to a system high voltage, and the second pad may be connected to a system low voltage or a ground voltage.

Figure 5:
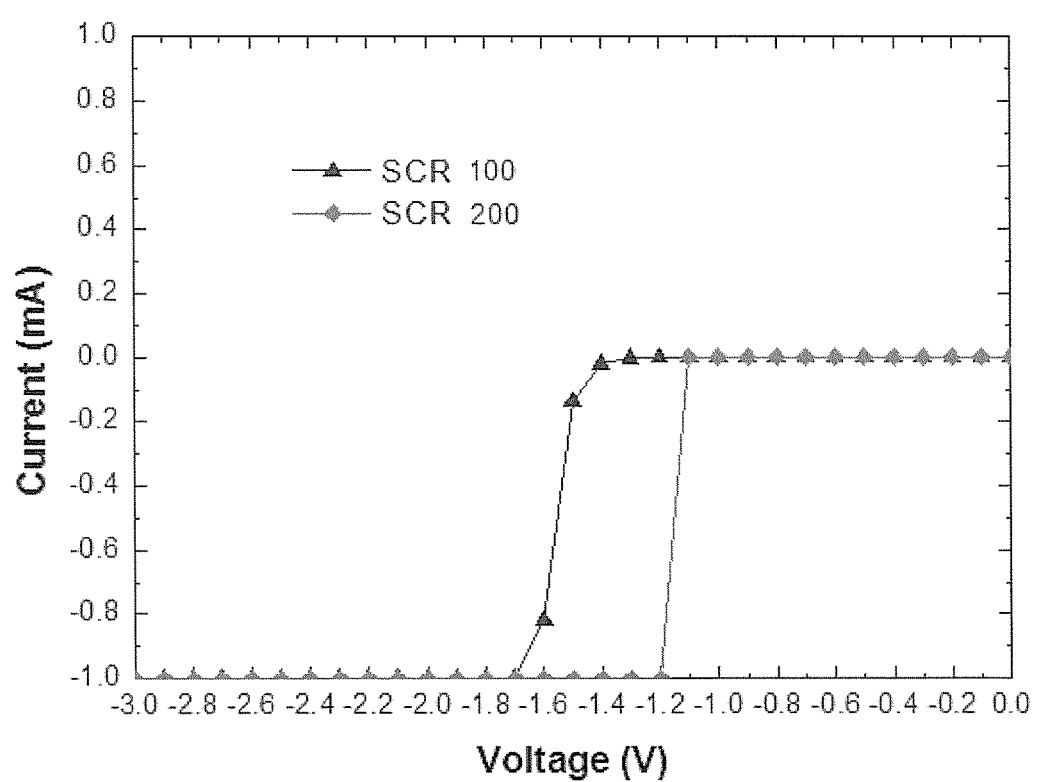
FIG. 5 illustrates a measurement result of current-voltage characteristics curve of the silicon controlled rectifier with different structures.

FIG. 5 illustrates a measurement result of current-voltage characteristics curve of the silicon controlled rectifier with different structures. Referring to FIG. 1 and FIG. 5, based on the semiconductor structure depicted in FIG. 1, the silicon controlled rectifier 100 of the present embodiment may be deemed as stacked diodes and at least suitable for high frequency circuit application. The disclosed diode-embedded silicon controlled rectifier 100 has a relatively low trigger voltage, e.g. 1.3 voltages, a relatively high electrostatic discharge (ESD) level, and a relatively low capacitance.

Figure 2:
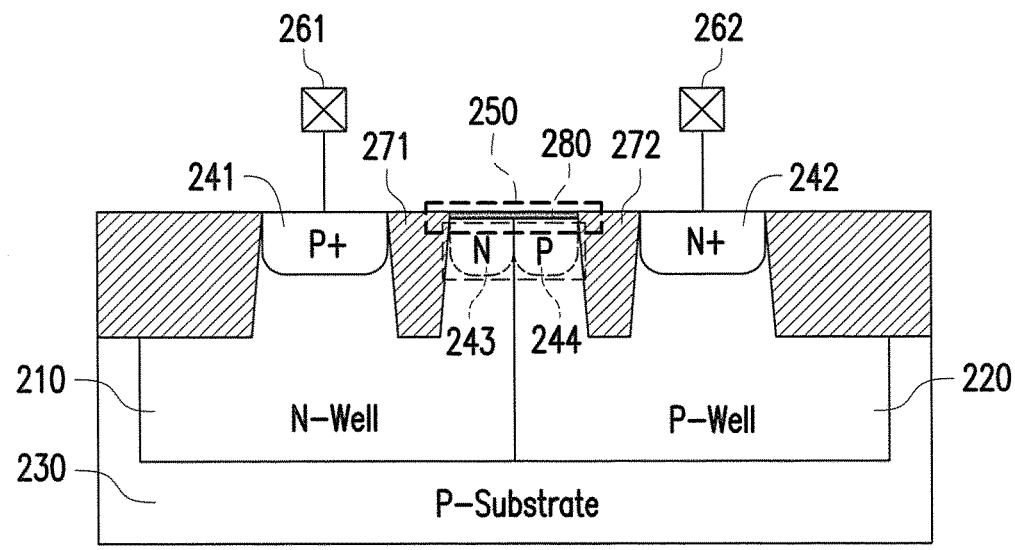
FIG. 2 illustrates a cross-sectional view of a silicon controlled rectifier according to another embodiment of the invention.

FIG. 2 illustrates a cross-sectional view of a silicon controlled rectifier according to another embodiment of the invention. Referring to FIG. 1 and FIG. 2, the silicon controlled rectifier 200 of the present embodiment is similar to the silicon controlled rectifier 100 depicted in FIG. 1. The main difference therebetween, for example, lies in that the third semiconductor region 243 and the fourth semiconductor region 244 are lightly doped regions. To be specific, the first semiconductor region 241 is a heavily doped p-type region, and the fourth semiconductor region 244 is a lightly doped p-type region. The second semiconductor region 242 is a heavily doped n-type region, and the third semiconductor region 243 is a lightly doped n-type region.

Referring to FIG. 2 and FIG. 5, based on the semiconductor structure depicted in FIG. 2, the silicon controlled rectifier 200 of the present embodiment may be deemed as stacked diodes and at least suitable for high frequency circuit application. The disclosed diode-embedded silicon controlled rectifier 200 has a relatively low trigger voltage, e.g. 1.1 voltages, a relatively high ESD level, and a relatively low capacitance.

Besides, the silicon controlled rectifier 200 described in this embodiment of the invention is sufficiently taught, suggested, and embodied in the embodiments illustrated in FIG. 1, and therefore no further description is provided herein.

Figure 3:
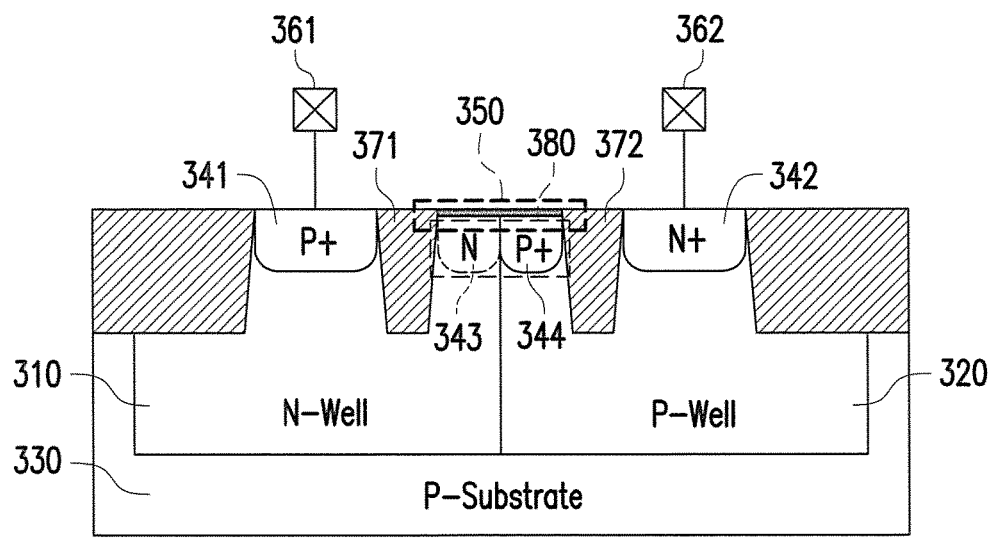
FIG. 3 illustrates a cross-sectional view of a silicon controlled rectifier according to another embodiment of the invention.

FIG. 3 illustrates a cross-sectional view of a silicon controlled rectifier according to another embodiment of the invention. Referring to FIG. 1 and FIG. 3, the silicon controlled rectifier 300 of the present embodiment is similar to the silicon controlled rectifier 100 depicted in FIG. 1. The main difference therebetween, for example, lies in that the second semiconductor region 342 is a heavily doped n-type region, and the third semiconductor region 343 is a lightly doped n-type region. Besides, the silicon controlled rectifier 300 described in this embodiment of the invention is sufficiently taught, suggested, and embodied in the embodiments illustrated in FIG. 1, and therefore no further description is provided herein. The silicon controlled rectifier 300 of the present embodiment may be deemed as stacked diodes and at least suitable for high frequency circuit application. The disclosed diode-embedded silicon controlled rectifier 300 has a relatively low trigger voltage, a relatively high ESD level, and a relatively low capacitance.

Figure 4:
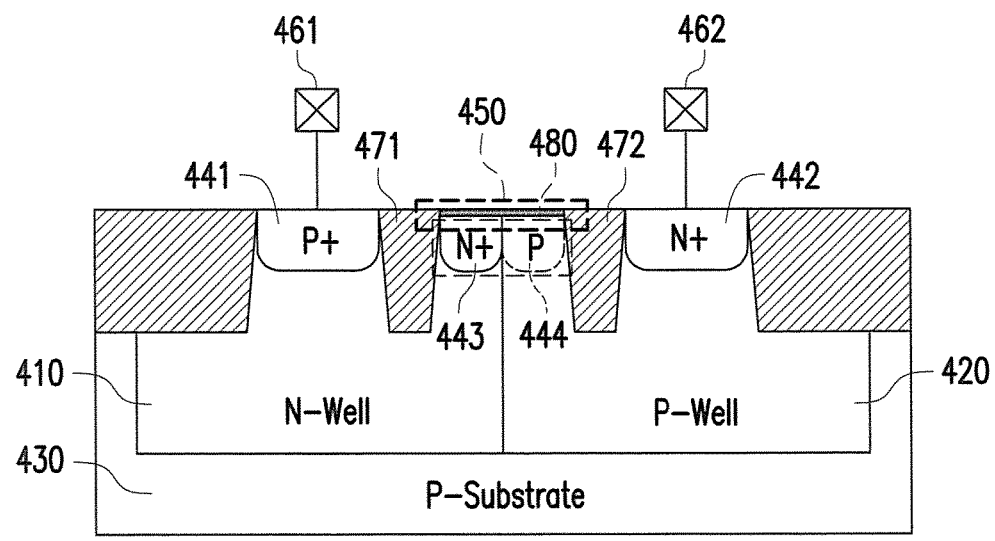
FIG. 4 illustrates a cross-sectional view of a silicon controlled rectifier according to another embodiment of the invention.

FIG. 4 illustrates a cross-sectional view of a silicon controlled rectifier according to another embodiment of the invention. Referring to FIG. 1 and FIG. 4, the silicon controlled rectifier 400 of the present embodiment is similar to the silicon controlled rectifier 100 depicted in FIG. 1. The main difference therebetween, for example, lies in that the first semiconductor region 441 is a heavily doped p-type region, and the fourth semiconductor region 444 is a lightly doped p-type region. Besides, the silicon controlled rectifier 400 described in this embodiment of the invention is sufficiently taught, suggested, and embodied in the embodiments illustrated in FIG. 1, and therefore no further description is provided herein. The silicon controlled rectifier 400 of the present embodiment may be deemed as stacked diodes and at least suitable for high frequency circuit application. The disclosed diode-embedded silicon controlled rectifier 400 has a relatively low trigger voltage, a relatively high ESD level, and a relatively low capacitance.

In summary, in the exemplary embodiments of the invention, the silicon controlled rectifier includes the third and the fourth semiconductor regions having silicon of different conductivity types. The third and the fourth semiconductor regions locate in the neighboring region of the first and the second semiconductor wells. For different embodiments, the third and the fourth semiconductor regions are lightly doped regions, or heavily doped regions. Alternatively, one of the third and the fourth semiconductor regions is a lightly doped region, and another one of the third and the fourth semiconductor regions is a heavily doped regions. The silicide layer is formed on the third and the fourth semiconductor regions. Accordingly, the silicon controlled rectifier has a relatively low trigger voltage, a relatively high ESD level, and a relatively low capacitance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon controlled rectifier comprising:
    a semiconductor substrate comprising silicon of a first conductivity type;
    first and second semiconductor wells formed in the semiconductor substrate, and respectively comprising silicon of a second conductivity type and silicon of the first conductivity type;
    first and second semiconductor regions respectively formed in the first and the second semiconductor wells in spaced apart relation, and respectively comprising silicon of the first conductivity type and silicon of the second conductivity type;
    third and fourth semiconductor regions respectively formed in the first and the second semiconductor wells, and respectively comprising silicon of the second conductivity type and silicon of the first conductivity type, wherein the third semiconductor region directly contacts with the fourth semiconductor region;
    a silicide layer formed on the third and the fourth semiconductor regions, wherein the silicide layer extends from the third semiconductor region to the fourth semiconductor region;
    a first insulating region formed in the first semiconductor well and located between the first and the third semiconductor regions; and
    a second insulating region formed in the second semiconductor well and located between the second and the fourth semiconductor regions,
    wherein the first insulating region and the second insulating region directly contact with two sides of the silicide layer.

2. The silicon controlled rectifier according to claim 1, wherein the third and the fourth semiconductor regions locate in a neighboring region of the first and the second semiconductor wells.

3. The silicon controlled rectifier according to claim 1, wherein the first and the fourth semiconductor regions are heavily doped regions.

4. The silicon controlled rectifier according to claim 1, wherein the first semiconductor region is a heavily doped region, and the fourth semiconductor region is a lightly doped region.

5. The silicon controlled rectifier according to claim 1, wherein the second and the third semiconductor regions are heavily doped regions.

6. The silicon controlled rectifier according to claim 1, wherein the second semiconductor region is a heavily doped region, and the third semiconductor region is a lightly doped region.

7. The silicon controlled rectifier according to claim 1, wherein the second conductivity type is different from the first conductivity type.

8. The silicon controlled rectifier according to claim 1, wherein material of the silicide layer is selected from at least one of TiSix, WSix, TaSix, CoSix and PtSi.

9. The silicon controlled rectifier according to claim 1, further comprising first and second pads respectively connected to the first and the second semiconductor regions, wherein the first and second pads are respectively connected to a first voltage and a second voltage, and the first voltage is higher than the second voltage.

* * * * *